United States Patent
Jagannathan et al.

(10) Patent No.: US 9,818,616 B1
(45) Date of Patent: Nov. 14, 2017

(54) CONTROLLING THRESHOLD VOLTAGE IN NANOSHEET TRANSISTORS

(71) Applicant: International Business Machines Corporation, Armonk, NY (US)

(72) Inventors: Hemanth Jagannathan, Niskayuna, NY (US); Paul C. Jamison, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/450,553

(22) Filed: Mar. 6, 2017

Related U.S. Application Data

(63) Continuation of application No. 15/275,846, filed on Sep. 26, 2016, now Pat. No. 9,653,537.

(51) Int. Cl.
  *H01L 29/06* (2006.01)
  *H01L 21/28* (2006.01)
  *H01L 29/40* (2006.01)
  *H01L 21/285* (2006.01)
  *H01L 29/66* (2006.01)

(52) U.S. Cl.
  CPC .. *H01L 21/28088* (2013.01); *H01L 21/28556* (2013.01); *H01L 29/0665* (2013.01); *H01L 29/401* (2013.01); *H01L 29/66439* (2013.01)

(58) Field of Classification Search
  CPC .............. H01L 29/0665; H01L 29/66439
  See application file for complete search history.

(56) References Cited

U.S. PATENT DOCUMENTS

| | | | |
|---|---|---|---|
| 7,326,656 B2* | 2/2008 | Brask | H01L 21/845 257/E21.442 |
| 8,207,449 B2* | 6/2012 | Tsakalakos | B82Y 10/00 174/261 |
| 8,344,357 B2* | 1/2013 | Kobayashi | B82Y 10/00 257/24 |
| 8,765,546 B1* | 7/2014 | Hung | H01L 21/823431 257/190 |
| 9,018,054 B2* | 4/2015 | Yoshida | H01L 21/28079 438/163 |
| 9,105,745 B2* | 8/2015 | Ando | H01L 21/823807 |
| 9,362,355 B1* | 6/2016 | Cheng | H01L 29/66742 |
| 9,425,291 B1* | 8/2016 | Balakrishnan | H01L 29/66795 |

(Continued)

OTHER PUBLICATIONS

List of IBM Patents or Patent Applications Treated as Related (Appendix P); Filed Mar. 6, 2017, 2 pages.

(Continued)

*Primary Examiner* — Evan Pert
(74) *Attorney, Agent, or Firm* — Cantor Colburn LLP; Vazken Alexanian

(57) ABSTRACT

Embodiments are directed to a method of forming a semiconductor device and resulting structures for controlling a threshold voltage on a nanosheet-based transistor. A nanosheet stack is formed over a substrate. The nanosheet stack includes a first nanosheet vertically stacked over a second nanosheet. A tri-layer gate metal stack is formed on each nanosheet. The tri-layer gate metal stack includes an inner nitride layer formed on a surface of each nanosheet, a doped transition metal layer formed on each inner nitride layer, and an outer nitride layer formed on each doped transition metal layer.

14 Claims, 7 Drawing Sheets

(56) References Cited

U.S. PATENT DOCUMENTS

| | | | | |
|---|---|---|---|---|
| 9,461,114 | B2* | 10/2016 | Obradovic | B82Y 10/00 |
| 9,653,537 | B1* | 5/2017 | Jagannathan | H01L 29/0665 |
| 2012/0056265 | A1* | 3/2012 | Liang | H01L 29/785 |
| | | | | 257/347 |
| 2013/0295298 | A1* | 11/2013 | Gatineau | C07F 5/06 |
| | | | | 427/576 |
| 2014/0264572 | A1* | 9/2014 | Kim | H01L 21/3083 |
| | | | | 257/331 |
| 2015/0194433 | A1* | 7/2015 | Ponoth | H01L 27/0924 |
| | | | | 326/38 |
| 2015/0295084 | A1* | 10/2015 | Obradovic | H01L 29/7845 |
| | | | | 257/347 |
| 2015/0364546 | A1* | 12/2015 | Rodder | H01L 29/1037 |
| | | | | 257/9 |
| 2016/0071729 | A1* | 3/2016 | Hatcher | H01L 29/1033 |
| | | | | 257/347 |
| 2016/0111284 | A1* | 4/2016 | Kittl | H01L 21/02532 |
| | | | | 438/488 |
| 2016/0111337 | A1* | 4/2016 | Hatcher | H01L 21/823807 |
| | | | | 438/154 |
| 2016/0126310 | A1* | 5/2016 | Rodder | H01L 29/41758 |
| | | | | 257/9 |
| 2016/0163796 | A1* | 6/2016 | Obradovic | B82Y 10/00 |
| | | | | 257/9 |
| 2016/0276478 | A1* | 9/2016 | Pawlak | H01L 29/0607 |
| 2017/0104081 | A1* | 4/2017 | Ding | C23C 16/0209 |
| 2017/0110554 | A1* | 4/2017 | Tak | H01L 29/4991 |

OTHER PUBLICATIONS

Hemanth Jagannathan, et al. "Controlling Threshold Voltage in Nanosheet Transistors," U.S. Appl. No. 15/275,846, filed Sep. 26, 2016.

* cited by examiner

CONTROLLING THRESHOLD VOLTAGE IN NANOSHEET TRANSISTORS

DOMESTIC PRIORITY

This application is a continuation of co-pending U.S. patent application Ser. No. 15/275,846, filed Sep. 26, 2016, the disclosure of which is incorporated by reference herein in its entirety.

BACKGROUND

The present invention relates in general to semiconductor device fabrication methods and resulting structures. More specifically, the present invention relates to fabrication methods and resulting structures for controlling the threshold voltage of a nanosheet-based transistor using a tri-layer gate metal stack.

In contemporary semiconductor device fabrication processes, a large number of semiconductor devices, such as field effect transistors (FETs), are fabricated on a single wafer. Some non-planar transistor device architectures, such as vertical field effect transistors (VFETs) and nanosheet-based transistors provide increased device density and some increased performance over lateral devices. In nanosheet-based transistors, in contrast to conventional FETs, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts in nanosheet devices also enable greater management of current leakage and parasitic capacitance in the active regions, even as drive currents increase.

SUMMARY

According to embodiments of the present invention, a method of fabricating a semiconductor device for controlling a threshold voltage on a nanosheet-based transistor is provided. The method can include forming a nanosheet stack over a substrate. The nanosheet stack includes a first nanosheet vertically stacked over a second nanosheet. A tri-layer gate metal stack is formed on each nanosheet. The tri-layer gate metal stack includes an inner nitride layer formed on a surface of each nanosheet, a doped transition metal layer formed on each inner nitride layer, and an outer nitride layer formed on each doped transition metal layer.

According to embodiments of the present invention, a method of fabricating a semiconductor device for controlling a threshold voltage on a nanosheet-based transistor is provided. The method can include forming a nanosheet over a substrate. A tri-layer gate metal stack is formed on the nanosheet. The tri-layer gate metal stack includes an inner nitride layer formed on a surface of the nanosheet, a doped transition metal layer formed on the inner nitride layer, and an outer nitride layer formed on the doped transition metal layer.

According to embodiments of the present invention, a structure for controlling a threshold voltage on a nanosheet-based transistor is provided. The structure can include a nanosheet stack formed over a substrate. The nanosheet stack includes a first nanosheet vertically stacked over a second nanosheet. A tri-layer gate metal stack is formed on each nanosheet. The tri-layer gate metal stack includes an inner nitride layer formed on each surface of the nanosheet, a doped transition metal layer formed on each inner nitride layer, and an outer nitride layer formed on each doped transition metal layer.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
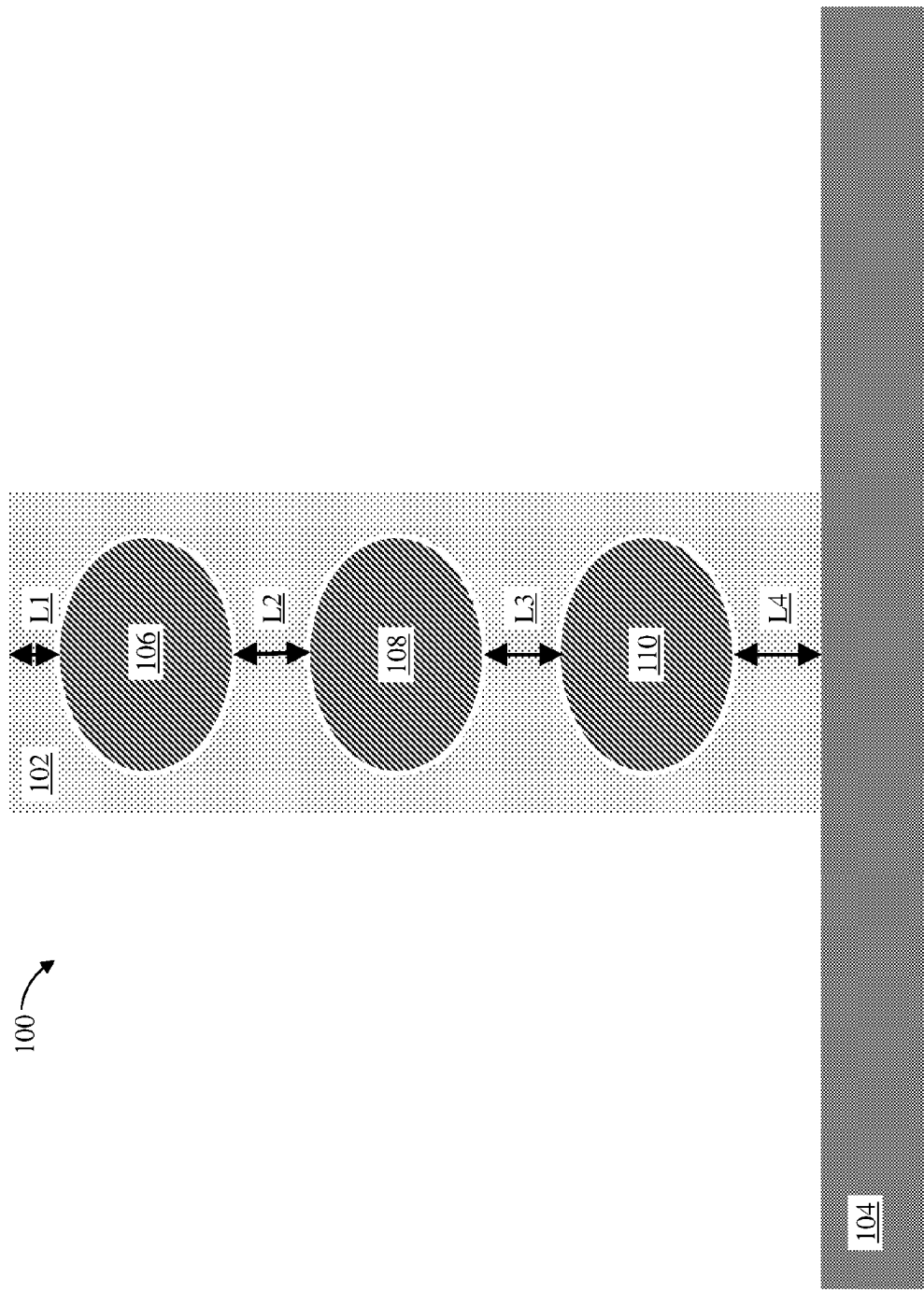
FIG. 1 depicts a cross-sectional view of a structure having a gate metal region formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop. The terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, some non-planar transistor device architectures, such as nanosheet-based FETs, result in increased device density over lateral devices. However, there are challenges in providing nanosheet-based FETs having equal or superior performance characteristics to lateral devices. For example, nanosheet-based transistors are susceptible to having channel sections with unequal gate metal thicknesses due to device to device variability in the distance between adjacent nanosheets. In some cases this issue is exacerbated because the gate metal material between adjacent nanosheets merges, leaving the gate metal thickness in the channel section between the adjacent nanosheets thicker than the gate metal thickness on an outer nanosheet. As currently practiced, the threshold voltage of nanosheet-based devices is set in part by tailoring the composition of the gate metal material to adjust the effective work function of the gate. The work function of typical gate metal materials, however, tends to vary with the thickness of the gate metal material, resulting in the threshold voltage of nanosheet-based transistors being sensitive to the thickness of the gate metal material in the channel sections. Consequently, there is considerable device to device threshold voltage variation for a single nominal device structure and processing condition. Thus, a method and structure is desired for controlling the threshold voltage on nanosheet-based transistors.

Turning now to an overview of aspects of the present invention, one or more embodiments provide methods of fabricating a semiconductor device and resulting structures for controlling the threshold voltage on nanosheet-based transistors. The described methods employ a tri-layer gate metal stack (tri-layer stack) wrapping around each nanosheet. The tri-layer stack includes an aluminum doped transition metal carbide layer between an inner titanium nitride layer and an outer titanium nitride layer. The three layers are conformally deposited in succession onto an exposed surface of each nanosheet. The tri-layer stack advantageously allows for the device threshold voltage to be tuned by adjusting the amount of aluminum doping present in the aluminum doped transition metal carbide layer. Moreover, the effective work function of the tri-layer stack does not depend on the thickness of the aluminum doped transition metal carbide layer even at thicknesses below 3 nm. In this manner the threshold voltage of the device, decoupled from the aluminum doped transition metal carbide layer thickness, is well-controlled, and the device to device threshold voltage variation is minimized. Methods for forming nanosheet-based transistors having tri-layer stacks and the resulting structures therefrom in accordance with embodiments of the present invention are described in detail below by referring to the accompanying drawings in FIGS. 1-7.

FIG. 1 illustrates a cross-sectional view of a structure 100 having a gate metal region 102 formed on a substrate 104 during an intermediate operation of a method of fabricating a semiconductor device according to one or more embodiments. The gate metal region 102 wraps around nanosheets 106, 108, and 110. The gate metal region 102 has a uniform composition and can be, for example, titanium carbide. The gate metal region 102 can be conformally or non-conformally formed. Forming the gate metal region 102 results in various channel section lengths L1, L2, L3, and L4 on each end of the nanosheets 106, 108, and 110 (e.g., channel section lengths L2 and L3 formed above and below nanosheet 108). The channel section lengths L2 and L3 can be formed by merging sections of the gate metal region 102 and, consequently, can be thicker than L1 and L4. For example, a portion of the gate metal region 102 from a bottom surface of nanosheet 106 can merge with a portion of the gate metal region 102 from a top surface of nanosheet 108 to result in the channel section length L2. As the work function of titanium carbide tends to vary with the thickness of the gate metal material (e.g., the channel section lengths L1, L2, L3, and L4), the threshold voltage of the structure 100 is sensitive to the channel section lengths L1, L2, L3, and L4.

Figure 2:
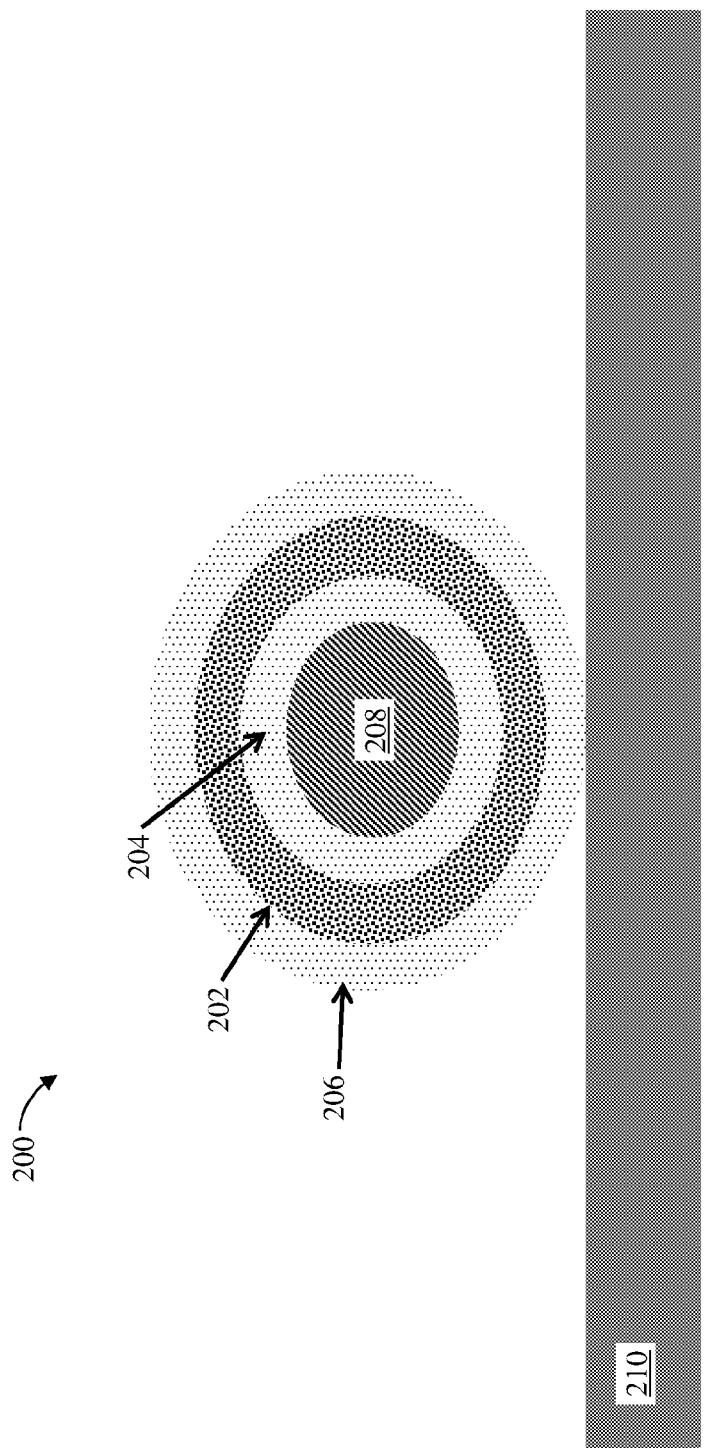
FIG. 2 depicts a cross-sectional view of a structure having a tri-layer gate metal stack wrapping around a nanosheet on a substrate during an intermediate operation of a method of fabricating a semiconductor device according to one or more embodiments of the present invention.

FIG. 2 illustrates a cross-sectional view of a structure 200 having a tri-layer gate metal stack (i.e., a doped transition metal layer 202 formed between an inner nitride layer 204 and an outer nitride layer 206) wrapping around a nanosheet 208 on a substrate 210 during an intermediate operation of a method of fabricating a semiconductor device according to one or more embodiments. The substrate 210 can be any suitable substrate material, such as, for example, monocrystalline Si, SiGe, SiC, III-V compound semiconductor, II-VI compound semiconductor, or semiconductor-on-insulator (SOI). The nanosheet 208 can be any suitable nanosheet material, such as, for example, silicon or silicon germanium.

The inner nitride layer 204 can be conformally formed on a surface of the nanosheet 208 using any suitable process. In some embodiments, the inner nitride layer 204 is conformally deposited using ALD. In some embodiments, the inner nitride layer 204 is about 1 to about 10 angstroms thick. In some embodiments, the inner nitride layer 204 includes titanium nitride.

The doped transition metal layer 202 is formed on the inner nitride layer 204. In some embodiments, the doped transition metal layer 202 is deposited using ALD. In some embodiments, the doped transition metal layer 202 includes aluminum doped transition metal carbide. In some embodiments, the doped transition metal layer 202 is formed using a hybrid ALD/CVD process having alternating pulses of a transition metal containing precursor and an aluminum carbide containing precursor. In some embodiments, the transition metal containing precursor includes niobium and the doped transition metal layer 202 is aluminum doped niobium carbide. The effective work function of an aluminum doped niobium carbide layer does not strongly depend on the thickness of the aluminum doped niobium carbide layer even at thicknesses below 3 nm, varying, for example, less than about 0.02 volts over a thickness range of about 20 to about 35 angstroms. Consequently, the threshold voltage of a device formed in this manner can be well-controlled, and device to device threshold voltage variation is minimized. In some embodiments, the doped transition metal layer 202 is about 20 to about 35 angstroms thick. In some embodiments, the doped transition metal layer 202 is about 5 to about 55 angstroms thick.

In some embodiments, the composition of the doped transition metal layer 202 is adjusted by varying the relative pulse lengths of the transition metal containing precursor and the aluminum carbide containing precursor. In some embodiments, the pulse length of the transition metal containing precursor is about 0.5 to about 1 second. In some embodiments, the pulse length of the aluminum carbide containing precursor is about 5 to about 15 seconds. In this manner the ratio of transition metal to aluminum carbide in the doped transition metal layer 202 can be controlled to achieve a desired device threshold voltage. For example, the pulse length of the aluminum carbide containing precursor can be increased while maintaining the pulse length of the transition metal containing precursor to lower the device threshold voltage. Similarly, the pulse length of the aluminum carbide containing precursor can be decreased while maintaining the pulse length of the transition metal containing precursor to increase the device threshold voltage. In some embodiments, the ratio of transition metal to aluminum carbide is about 0.25 to about 1.0. In some embodiments, the composition of the doped transition metal layer 202 is adjusted by varying the temperature of the substrate during the deposition process. In some embodiments, the temperature of the substrate during the deposition process is about 400 degrees Celsius. In some embodiments, the doped transition metal layer 202 is aluminum doped niobium carbide having a thickness range of about 20 to about 35 angstroms and the threshold voltage varies less than about 0.02 volts.

The outer nitride layer 206 can be conformally formed on the doped transition metal layer 202 in a like manner as the inner nitride layer 204 formed on the surface of the nanosheet 208. In some embodiments, the outer nitride layer 206 is conformally deposited using ALD. In some embodiments, the outer titanium nitride 206 is about 1 to about 30 angstroms thick. In some embodiments, the outer nitride layer 206 includes titanium nitride.

In some embodiments, a gate dielectric region (not illustrated) is formed between the nanosheet 208 and the inner nitride layer 204. The gate dielectric region can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the gate dielectric region can have a thickness of about 0.5 nm to about 4 nm. In some embodiments, the gate dielectric region can have a thickness of about 2 nm to about 3 nm.

Figure 3:
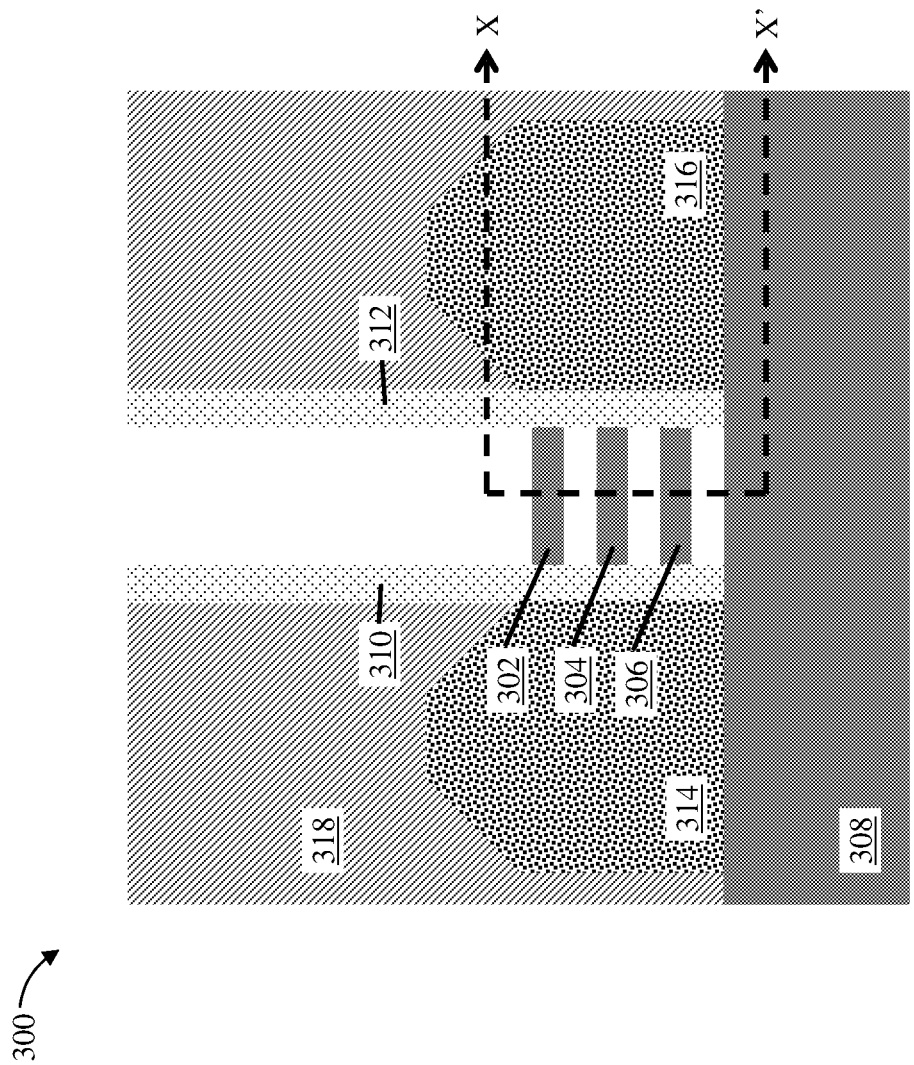
FIG. 3 depicts a cross-sectional channel length view of a structure having a nanosheet stack formed on a substrate during an intermediate operation of a method of fabricating a semiconductor device according to one or more embodiments of the present invention.

FIG. 3 illustrates a cross-sectional channel length view of a structure 300 having a nanosheet stack (i.e., vertically stacked nanosheets 302, 304, and 306) formed on a substrate 308 during an intermediate operation of a method of fabricating a semiconductor device according to one or more embodiments. For ease of illustration, only nanosheets 302, 304, and 306 are depicted. It is understood that the nanosheet stack can include one, two, or a plurality of nanosheets. In some embodiments, sacrificial spacers (not depicted) between each pair of adjacent nanosheets (e.g., nano sheets 302 and 304) are removed selective to the nanosheets 302, 303, and 306. In some embodiments, the sacrificial spacers are removed using a wet or dry etch process.

In some embodiments, the structure 300 includes outer spacers 310 and 312 formed on opposite ends of the nanosheets 302, 304, and 306. In some embodiments, the outer spacers 310 and 312 are each deposited using CVD, PECVD, ALD, PVD, chemical solution deposition, or other like processes. The outer spacers 310 and 312 can be of any suitable material, such as, for example, a low-k dielectric, a nitride, silicon nitride, silicon dioxide, a silicon oxynitride (SiON), a silicon carbide (SiC), a silicon oxygen carbonitride (SiOCN), or a silicoboron carbonitride (SiBCN).

In some embodiments, doped regions 314 and 316 are formed on the substrate 308. The doped regions 314 and 316 can be source or drain regions formed in the substrate 308 by a variety of methods, such as, for example, diffusion and/or ion implantation. In some embodiments, the doped regions 314 and 316 are complementary, such that one of the doped regions 314 and 316 is a source while the other is a drain. The doped regions 314 and 316 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, doped regions 314 and 316 include epitaxial semiconductor materials grown from gaseous or liquid precursors. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium). The dopant concentration in the doped regions 314 and 316 can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 314 and 316 include silicon. In some embodiments, the doped regions 314 and 316 include carbon doped silicon (Si:C). This Si:C layer can be grown in the same chamber used for other epitaxy steps or in a dedicated Si:C epitaxy chamber. The Si:C can include carbon in the range of 0.2 to 3.0%.

In some embodiments, an interlayer dielectric (ILD) 318 is formed over the doped regions 314 and 316 and the substrate 308. The ILD 318 can be any suitable material, such as, for example, porous silicates, carbon doped oxides, silicon dioxides, silicon nitrides, silicon oxynitrides, or other dielectric materials. Any known manner of forming the ILD 318 can be utilized. The ILD 318 can be formed using, for example, CVD, PECVD, ALD, flowable CVD, spin-on dielectrics, or PVD. In some embodiments, the ILD 800 is planarized to a top surface of the outer spacers 310 and 312, using, for example, a CMP operation.

Figure 4:
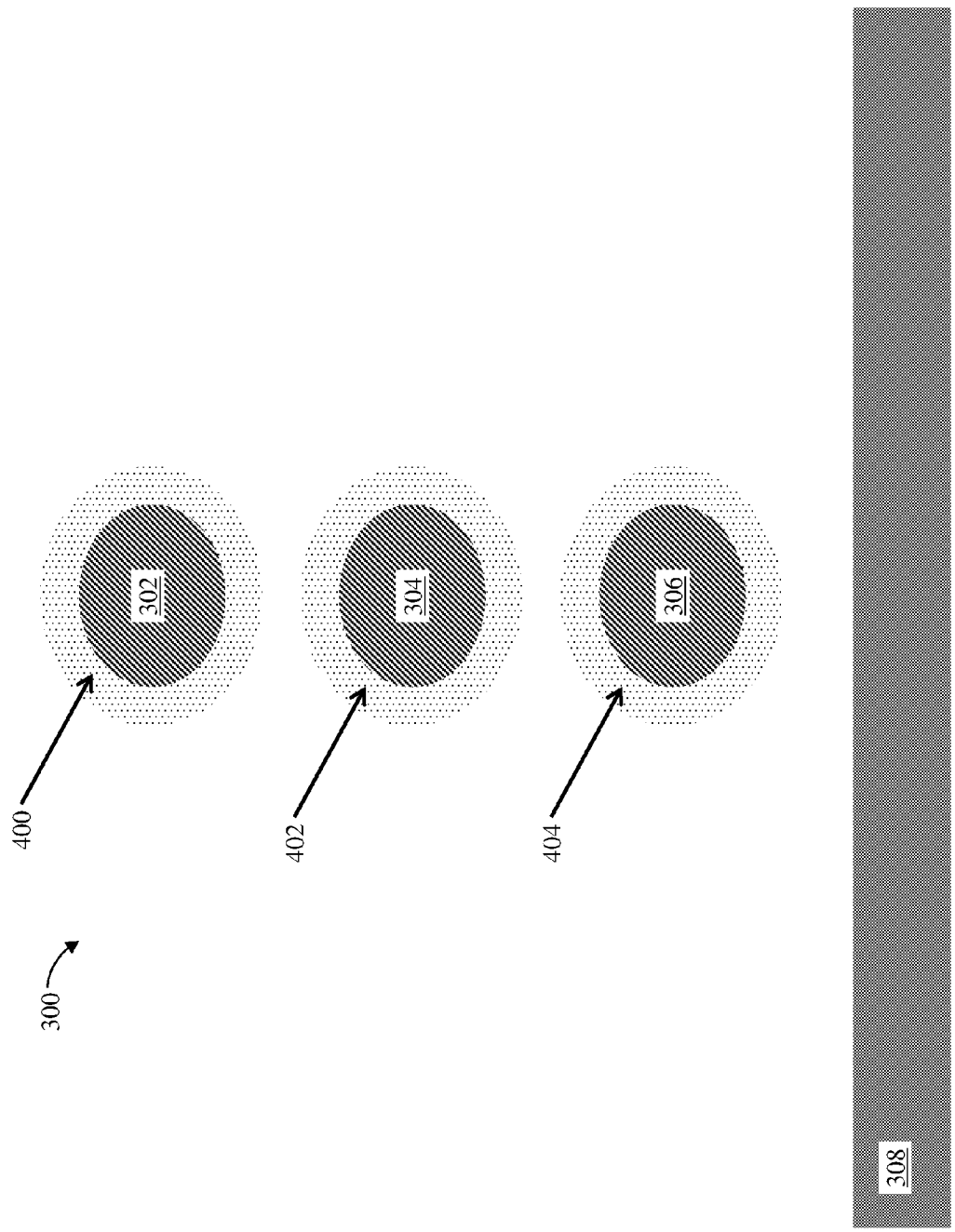
FIG. 4 depicts a cross-sectional channel width view along the line X-X' of FIG. 3 of the structure after forming inner nitride layers on a surface of each of the nanosheets during an intermediate operation of a method of fabricating a semiconductor device according to one or more embodiments of the present invention.

FIG. 4 illustrates a cross-sectional channel width view of the structure 300 along the line X-X' of FIG. 3 after forming inner nitride layers 400, 402, and 404 on a surface of the nanosheets 302, 304, and 306, respectively, during an intermediate operation of a method of fabricating a semiconductor device according to one or more embodiments. The inner nitride layers 400, 402, and 404 can be of a similar composition and formed in a similar manner as the inner nitride layer 204 (as depicted in FIG. 2). In some embodiments, the inner nitride layers 400, 402, and 404 are titanium nitride layers.

Figure 5:
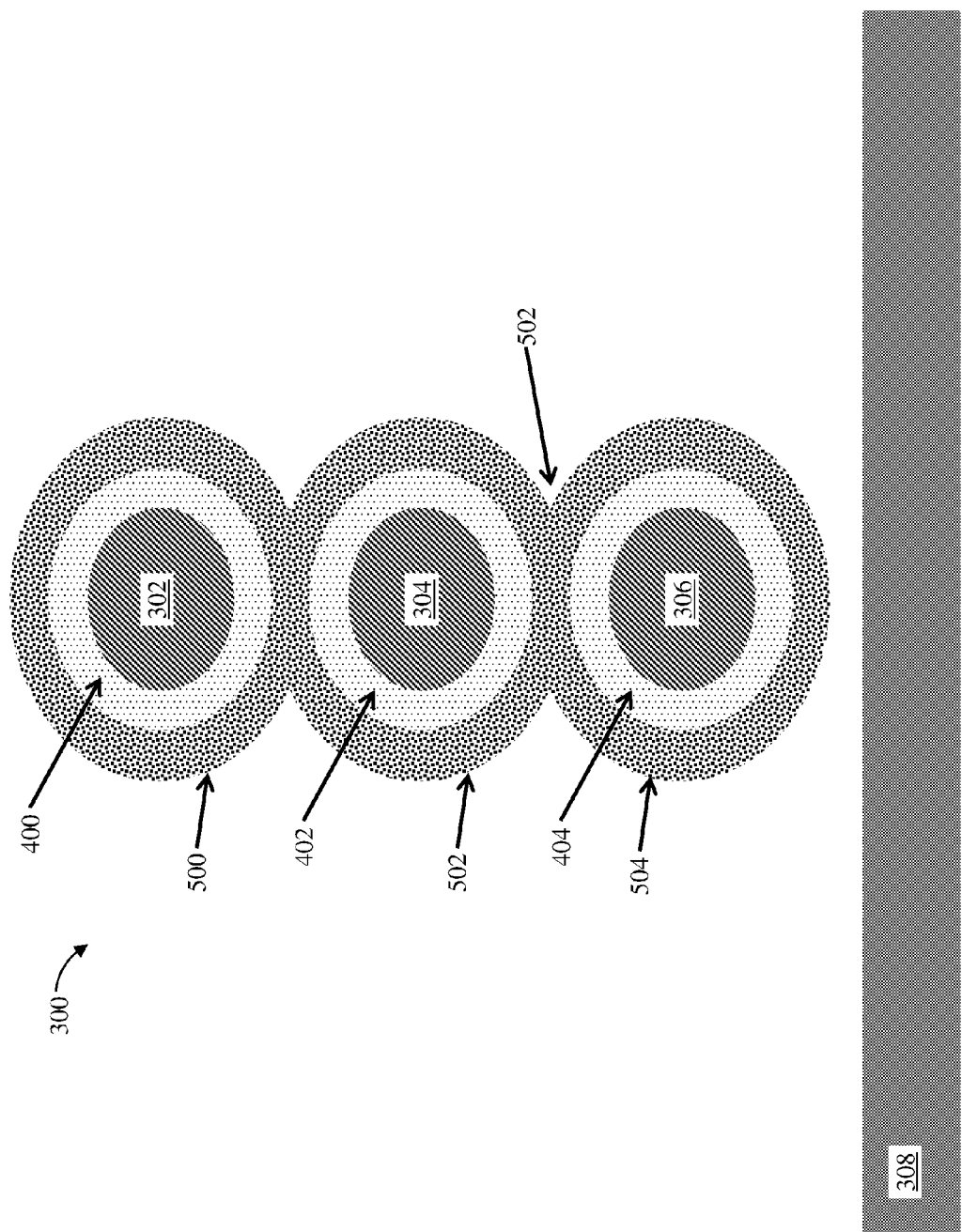
FIG. 5 depicts a cross-sectional channel width view along the line X-X' of FIG. 3 of the structure after forming doped transition metal layers on a surface of each of the inner nitride layers during an intermediate operation of a method of fabricating a semiconductor device according to one or more embodiments of the present invention.

FIG. 5 illustrates a cross-sectional channel width view of the structure 300 along the line X-X' of FIG. 3 after forming doped transition metal layers 500, 502, and 504 on a surface of the inner nitride layers 400, 402, and 404, respectively, during an intermediate operation of a method of fabricating a semiconductor device according to one or more embodiments. The doped transition metal layers 500, 502, and 504 can be of a similar composition and formed in a similar manner as the doped transition metal layer 202 (as depicted in FIG. 2). In some embodiments, the doped transition metal layers 500, 502, and 504 are aluminum doped transition metal carbide layers. In some embodiments, the doped transition metal layers 500, 502, and 504 are aluminum doped niobium carbide layers. In some embodiments, the distance between adjacent nanosheets (e.g., nanosheets 304 and 306) is small (i.e., less than the width required for each of the inner nitride layers 402 and 404 and the doped transition metal layers 502 and 504) and conformally forming the doped transition metal layers (e.g., doped transition metal layers 502 and 504) results in portions of the doped transition metal layers to form a merged layer (e.g., merged layer 502 between nanosheets 304 and 306). In some embodiments, the merged layer 502 is thicker than the unmerged portions of the doped transition metal layers 500, 502, and 504.

Figure 6:
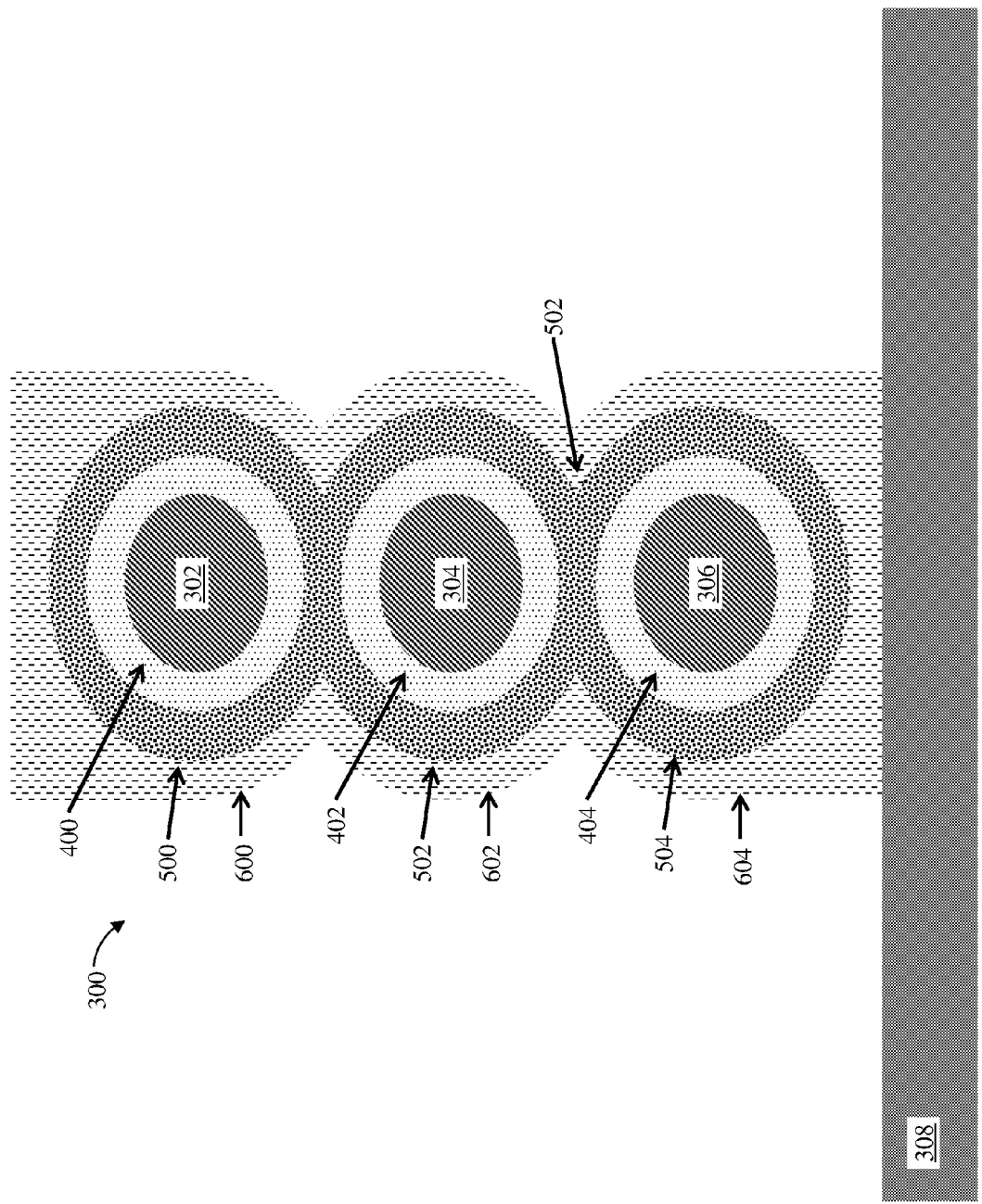
FIG. 6 depicts a cross-sectional channel width view along the line X-X' of FIG. 3 of the structure after forming outer nitride layers on a surface of each of the doped transition metal layers during an intermediate operation of a method of fabricating a semiconductor device according to one or more embodiments of the present invention.

FIG. 6 illustrates a cross-sectional channel width view of the structure 300 along the line X-X' of FIG. 3 after forming outer nitride layers 600, 602, and 604 on a surface of the doped transition metal layers 500, 502, and 504, respectively, during an intermediate operation of a method of fabricating a semiconductor device according to one or more embodiments. The outer nitride layers 600, 602, and 604 can be of a similar composition and formed in a similar manner as the outer nitride layer 206 (as depicted in FIG. 2). In some embodiments, the outer nitride layers 600, 602, and 604 are titanium nitride layers. In some embodiments, the distance between adjacent nanosheets (e.g., nanosheets 304 and 306) is small (i.e., less than the width required for each of the inner nitride layers 402 and 404, doped transition metal layers 502 and 504, and outer nitride layers 602 and 604) and conformally forming the outer nitride layers 600, 602, and 604 results in portions of the outer nitride layers 600, 602, and 604 to merge in a similar manner as the merged layer 502 of the doped transition metal layers 500, 502, and 504.

Figure 7:
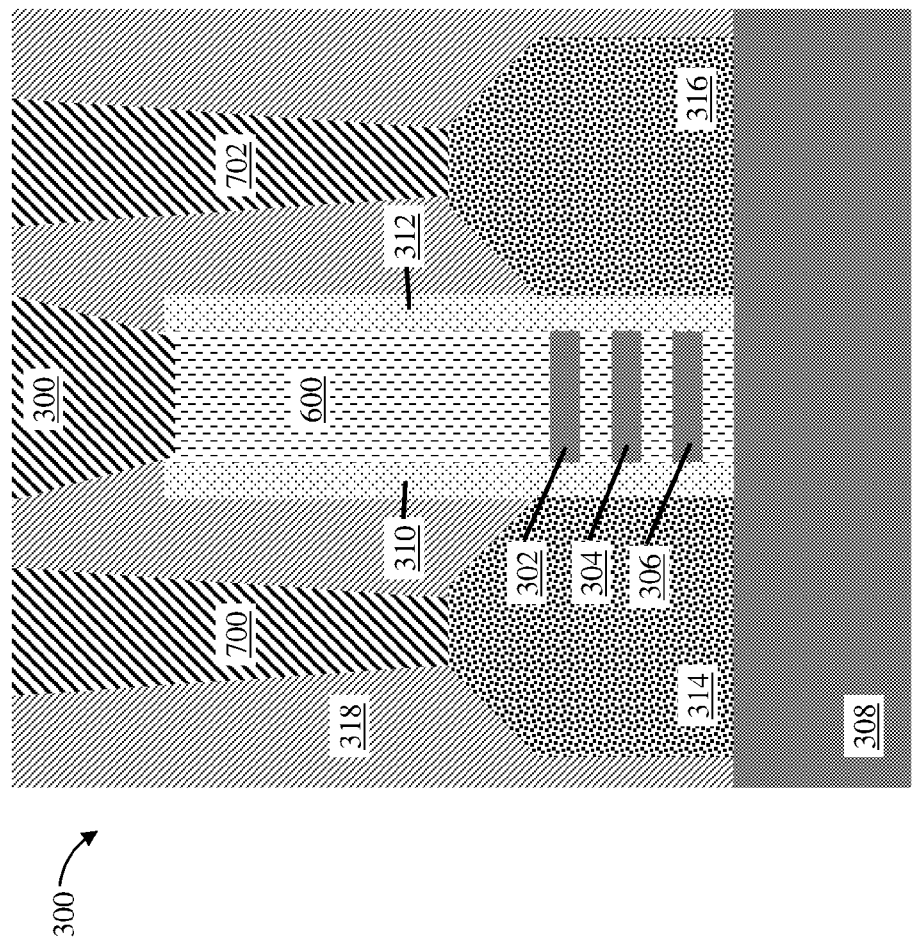
FIG. 7 depicts a cross-sectional channel length view of the structure after forming the outer nitride layers during an intermediate operation of a method of fabricating a semiconductor device according to one or more embodiments of the present invention.

FIG. 7 illustrates a cross-sectional channel length view of the structure 300 after forming the outer nitride layers 600, 602, and 604 during an intermediate operation of a method of fabricating a semiconductor device according to one or more embodiments. In some embodiments, a metallization operation deposits a first contact 700 contacting a surface of the doped region 314, a second contact 702 contacting a surface of the doped region 316, and a third contact 704 contacting a surface of the outer nitride layer 600 in the ILD 318. Any known manner of depositing the contacts 700, 702, and 704 can be utilized. In some embodiments, the ILD 318 is patterned with open trenches and the contacts 700, 702, and 704 are deposited into the trenches. In some embodiments, the contacts 700, 702, and 704 are overfilled into the trenches to each form an overburden above a surface of the ILD 318. In some embodiments, a CMP selective to the ILD 318 removes the overburden.

The contacts 700, 702, and 704 can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts 700, 702, and 704 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a nanosheet stack over a substrate, the nanosheet stack comprising a first nanosheet vertically stacked over a second nanosheet;
    forming an inner nitride layer on a surface of each nanosheet; and
    alternating pulses of a first precursor comprising a transition metal and a second precursor comprising an aluminum carbide to form a doped transition metal layer on each inner nitride layer.

2. The method of claim 1, wherein a duration of the pulse of the second precursor is increased while a duration of the pulse of the first precursor is held fixed to increase a concentration of aluminum in the doped transition metal layer.

3. The method of claim 2, wherein increasing the duration of the pulse of the second precursor is operable to lower a threshold voltage.

4. The method of claim 1, wherein a duration of the pulse of the second precursor is decreased while a duration of the pulse of the first precursor is held fixed to decrease a concentration of aluminum in the doped transition metal layer.

5. The method of claim 4, wherein decreasing the duration of the pulse of the second precursor is operable to increase a threshold voltage.

6. The method of claim 1, wherein a duration of the pulse of the second precursor is about 5 seconds to about 15 seconds.

7. The method of claim 1, wherein a duration of the pulse of the first precursor is about 0.5 seconds to about 1 second.

8. The method of claim 1, wherein a ratio of transition metal to aluminum carbide in the doped transition metal layer is about 0.25 to 1.0.

9. The method of claim 1, wherein portions of the doped transition metal layers between the first and second nanosheets merge.

10. The method of claim 1, wherein the inner nitride layer comprises titanium nitride.

11. The method of claim 10, wherein a thickness of the inner nitride layer is about 1 to about 10 angstroms.

12. The method of claim 1, wherein the doped transition metal layer comprises aluminum doped transition metal carbide.

13. The method of claim 12, wherein the doped transition metal layer further comprises aluminum doped niobium carbide.

14. The method of claim 13, wherein a thickness of the doped transition metal layer is about 20 to about 35 angstroms.

* * * * *